United States Patent
Lin

(10) Patent No.: US 9,348,389 B2
(45) Date of Patent: May 24, 2016

(54) POWER MEASUREMENT SYSTEM FOR MULTIPLE POWER SOURCES AND METHOD OF OPERATING THE SAME

(71) Applicant: Getac Technology Corporation, Hsinchu County (TW)

(72) Inventor: Hsin-Chih Lin, New Taipei (TW)

(73) Assignee: Getac Technology Corporation, Hsinchu County (TW)

( * ) Notice: Subject to any disclaimer, the term of this patent is extended or adjusted under 35 U.S.C. 154(b) by 643 days.

(21) Appl. No.: 13/786,126

(22) Filed: Mar. 5, 2013

(65) Prior Publication Data

US 2014/0122001 A1    May 1, 2014

(30) Foreign Application Priority Data

Oct. 26, 2012   (CN) .......................... 2012 1 0414806

(51) Int. Cl.
*G01R 21/00* (2006.01)
*G06F 1/28* (2006.01)
*G01R 21/133* (2006.01)

(52) U.S. Cl.
CPC ............... *G06F 1/28* (2013.01); *G01R 21/133* (2013.01)

(58) Field of Classification Search
CPC ................. G01R 21/06; G01R 21/133; G01R 31/31721; G01R 35/02; G06F 1/28
See application file for complete search history.

(56) References Cited

U.S. PATENT DOCUMENTS

| | | | | |
|---|---|---|---|---|
| 7,830,039 B2* | 11/2010 | Nguyen | .................... | G06F 1/28 307/85 |
| 7,847,783 B2* | 12/2010 | Liu | ........................ | G09G 3/342 315/167 |
| 2013/0120010 A1* | 5/2013 | Edgar, III | ............... | G01R 21/06 324/750.01 |

FOREIGN PATENT DOCUMENTS

TW    I301899    10/2008
TW    M385003    7/2010

* cited by examiner

*Primary Examiner* — Elias Desta

(57) ABSTRACT

A power measurement system for multiple power sources includes a plurality of measurement apparatuses, a multiplexer, and a processing module. Each of the measurement apparatuses has a sense resistor and a sense amplifier. The sense resistor is electrically connected to a power source at one terminal thereof and electrically connected to a load at the other terminal thereof. The sense amplifier receives a voltage difference across the sense resistor, amplifies the voltage difference by a gain value, and outputs an amplified sense voltage. The multiplexer receives the amplified sense voltages and outputs one of the amplified sense voltages. The processing module receives the one amplified sense voltage outputted from the multiplexer and calculates an output power of the power source according to the one amplified sense voltage. Furthermore, a method of operating the power measurement system is provided.

19 Claims, 7 Drawing Sheets

POWER MEASUREMENT SYSTEM FOR MULTIPLE POWER SOURCES AND METHOD OF OPERATING THE SAME

BACKGROUND OF THE INVENTION

1. Field of the Invention

The present disclosure relates generally to a power measurement system for multiple power sources and a method of operating the same, and more particularly to a power measurement system for multiple power sources and a method of operating the same that a multiplexer is included to be used.

2. Description of Prior Art

Reference is made to FIG. 1 which is a schematic circuit block diagram of a prior art power detection apparatus and a management apparatus thereof. The power detection apparatus and the management apparatus thereof are disclosed in TW Patent M385003. The power detection apparatus 10 includes an input current detector 111, an input voltage detector 112, and a digital microprocessor 12. The power detection apparatus 10 is applied to detect power of a computer system, in which the power system is a load 2 shown in the FIG. 1. A power source 1 provides an AC power and the AC power is converted into a DC power by a power converter 21, and then the DC power is converted into the required DC voltage by a power supply module 20 for supplying power to a load 2, such as a computer system. The power detection apparatus 10 is provided to accurately detect consumed power of the load 2 and a power supply in a single power-supplying loop, and further accurately detect consumed power in multiple power-supplying loops. In addition, the results of detecting consumed power are sent to a power management system via communication buses.

An input current IPI and an input voltage IPV are detected to calculate consumed power IPW of the computer system. In particular, the consumed power IPW is equal to IPI×IPV, namely, IPW=IPI×IPV.

The power detection apparatus 10 is mainly composed of an input detection module 11 and the digital microprocessor 12. The input detection module 11 is composed of the input current detector 111 and the input voltage detector 112. The input current detector 111 is connected in series to the power source 1 and the power converter 21 to detect the input current IPI between the power source 1 and the power converter 21, and then output the value of the input current IPI to the digital microprocessor 12. The input voltage detector 112 is connected in parallel to the power converter 21 to detect the input voltage IPV of the power supply module 20, and then output the value of the input voltage IPV to the digital microprocessor 12. The digital microprocessor 12 receives the value of the input current IPI and the value of the input voltage IPV to calculate the value of the input power IPW.

Reference is made to FIG. 2 which is a schematic circuit block diagram of a prior art apparatus and a method for measuring the amount of current in battery cells using a plurality of sensing resistors. The apparatus and method for measuring the amount of current in battery cells using a plurality of sensing resistors are disclosed in TW Patent I301899. The apparatus includes a plurality of resistors R1, R2, R3, a main chip 201, a multiplexer 202, and a plurality of switches S1, S2, S3. The resistors R1, R2, R3 are connected in parallel to measure the amount of current in battery cells C1, C2, C3, C4. The main chip 201 is connected to each of the resistors R1, R2, R3 to detect the amount of the voltage across the resistors R1, R2, R3 so that the amount of current can be summed up according to the detected voltage values. When the summed amount of current exceeds a predetermined threshold value, another resistor is selected by the multiplexer 202. The switches S1, S2, S3 are connected to the resistors R1, R2, R3, respectively, and are controlled to be turned on or turned off by an output signal produced by the multiplexer 202. Accordingly, heat generated from the individual resistor can be dissipated to prevent damaging surrounding components and the amount of current can be accurately detected.

The battery cells C1, C2, C3, C4 are connected in parallel to the resistors R1, R2, R3 so that the current in battery cells C1, C2, C3, C4 flows through the resistors R1, R2, R3. Because the battery cells C1, C2, C3, C4 are connected in parallel to the resistors R1, R2, R3 with different resistance values, currents outputted from the battery cells C1, C2, C3, C4 will be distributed and flows through the resistors R1, R2, R3. First, the current from the battery cells C1, C2, C3, C4 flows through the resistor R1, the main chip 201 detects the voltage across the resistor R1, and then adds up it as an amount of current. The amount of current added up reaches a predetermined threshold value with the lapse of time. When the amount of current detected at the resistor R1 reaches the predetermined threshold value, the main chip 201 instructs the multiplexer 202 to switch on the switch S2 of the resistor R2. On the basis of the instruction of the main chip 201, the multiplexer 202 switches on the switch S2. Accordingly, the current from the battery cells C1, C2, C3, C4 is distributed and flows through the resistors R1 and R2. The main chip 201 detects the voltage across each of the resistors R1 and R2, and adds up each amount of current. Similarly, the amount of current added up reaches a predetermined threshold value with the lapse of time.

When the amount of current detected at the resistors R1 and R2 reaches the predetermined threshold value, the main chip 201 instructs the multiplexer 202 to switch on the switch S3 of the resistor R3. On the basis of the instruction of the main chip 201, the multiplexer 202 switches on the switch S3. Accordingly, heat generated from the individual resistor can be dissipated to prevent damaging surrounding components and the amount of current can be accurately detected.

Accordingly, the power detection apparatus disclosed in TW Patent M385003 can be provided to accurately detect consumed power of the load and the power supply in a single power-supplying, and further in multiple power-supplying loops. In addition, the apparatus for measuring the amount of current in battery cells using a plurality of sensing resistors disclosed in TW Patent I301899 can be provided to prevent damaging surrounding components because heat generated from the individual resistor can be dissipated by using the multiplexer to switch on the switches and the amount of current can be accurately detected. However, the two patents do not disclose that a power measurement system for multiple power sources and a method of operating the same are provided to calculate output powers of different power sources by using a multiplexer which is connected to the power sources and controlling the multiplexer via external selection signals.

SUMMARY OF THE INVENTION

An object of the present disclosure is to provide a power measurement system for multiple power sources to solve the above-mentioned problems. Accordingly, the power measurement system is provided to calculate output powers of different power sources. The power measurement system includes a plurality of measurement apparatuses, a multiplexer, and a processing module. Each of the measurement apparatuses has a sense resistor and a sense amplifier. One terminal of the sensor resistor is electrically connected to a power source and the other terminal of the sensor resistor connected to a load. The sense amplifier receives a voltage difference across the sense resistor, amplifies the voltage difference with a gain value, and outputs an amplified sense voltage. The multiplexer has a plurality of data input terminals, a data output terminal, and at least one data selection terminal. The data input terminals receive the amplified sense voltages outputted from the measurement apparatuses, respectively. The processing module outputs at least one selection signal to the at least one data selection terminal, controls the multiplexer selecting one of the amplified sense voltages outputted from the data output terminal of the multiplexer, and receives the selected amplified sense voltage. The processing module calculates an output power of the power source according to the received amplified sense voltage.

Another object of the present disclosure is to provide a method of operating a power measurement system for multiple power sources to solve the above-mentioned problems. Accordingly, steps of the method include: a plurality of measurement apparatuses are provided, each of the measurement apparatuses has a sense resistor, one terminal of the sensor resistor electrically connected to a power source and the other terminal of the sensor resistor connected to a load; a voltage difference across the sense resistor is received; the voltage difference with a gain value to produce an amplified sense voltage is amplified; the amplified sense voltages are received; one of the amplified sense voltages is selected; and an output power of the power source is calculated according to the selected amplified sense voltage.

It is to be understood that both the foregoing general description and the following detailed description are exemplary, and are intended to provide further explanation of the invention as claimed. Other advantages and features of the invention will be apparent from the following description, drawings and claims.

BRIEF DESCRIPTION OF DRAWING

The features of the invention believed to be novel are set forth with particularity in the appended claims. The invention itself, however, may be best understood by reference to the following detailed description of the invention, which describes an exemplary embodiment of the invention, taken in conjunction with the accompanying drawings, in which:

DETAILED DESCRIPTION OF THE INVENTION

Figure 1:
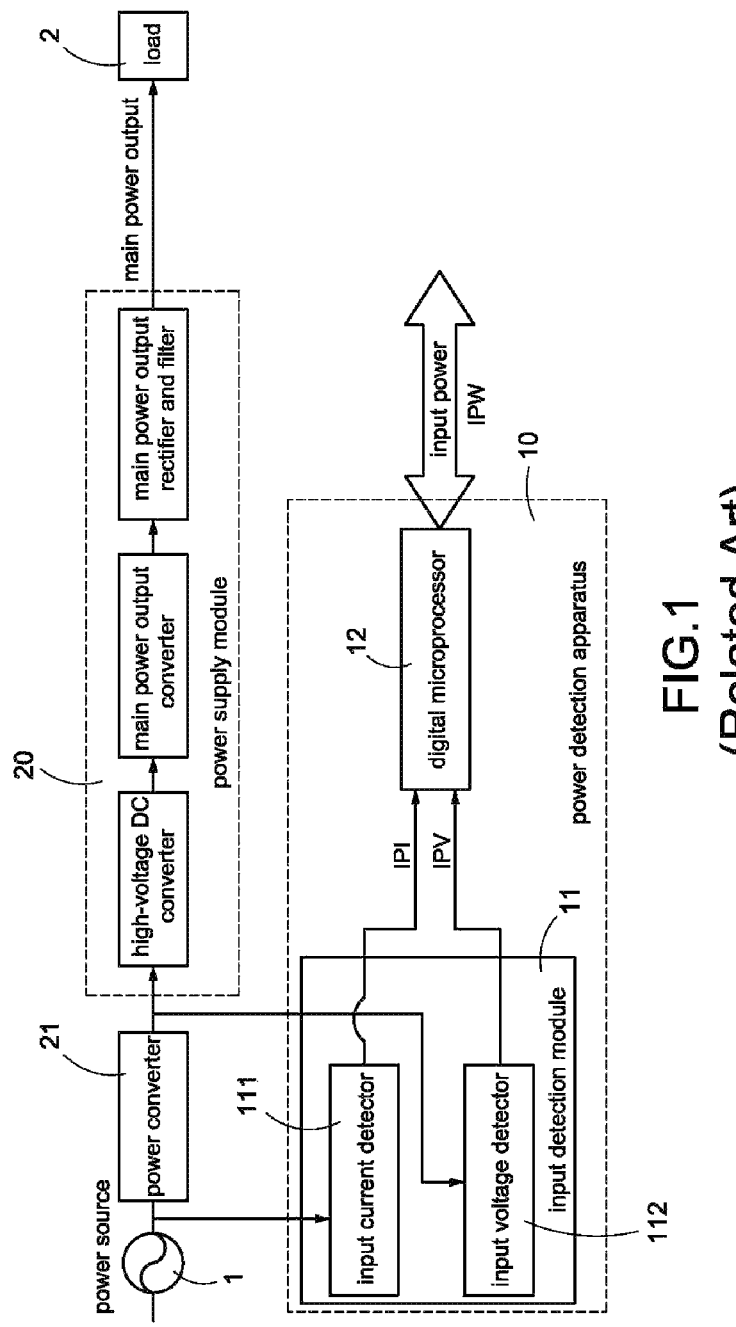
FIG. 1 is a schematic circuit block diagram of a prior art power detection apparatus and a management apparatus thereof.
Figure 2:
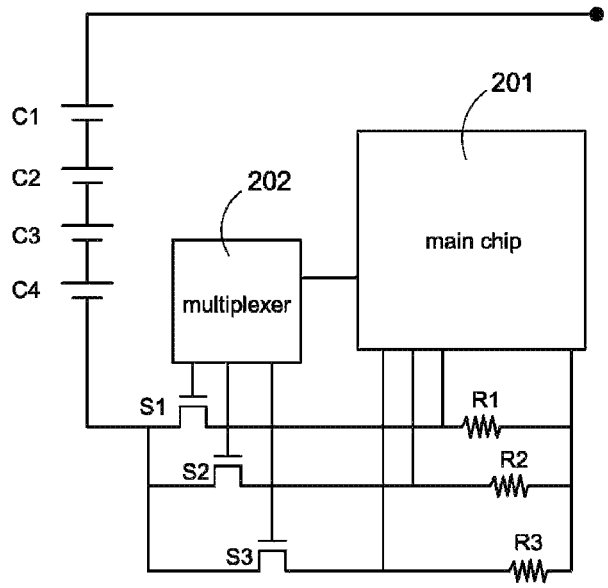
FIG. 2 is a schematic circuit block diagram of a prior art apparatus and a method for measuring the amount of current in battery cells using a plurality of sensing resistors.

Reference will now be made to the drawing figures to describe the present invention in detail.

Figure 3:
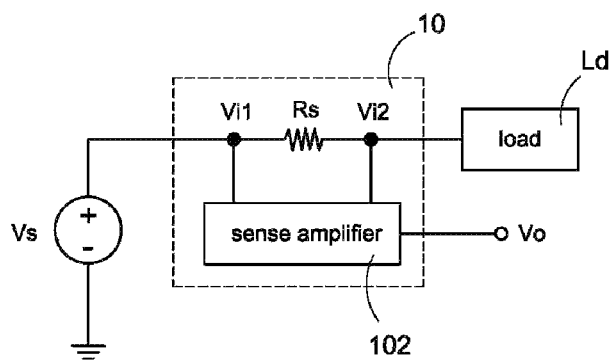
FIG. 3 is a schematic circuit block diagram of a measurement apparatus of the power measurement system for multiple power sources according to the present disclosure.

Reference is made to FIG. 3 which is a schematic circuit block diagram of a measurement apparatus of the power measurement system for multiple power sources according to the present disclosure. The measurement apparatus 10 has a sense resistor Rs and a sense amplifier 102. One terminal of the sense resistor Rs is electrically connected to a power source Vs and the other terminal of the sense resistor Rs is connected to a load Ld. The sense amplifier 102 receives a voltage difference across the sense resistor Rs, that is, the sense amplifier 102 receives a first input voltage Vi1 (namely, one terminal voltage of the sense resistor Rs) and a second input voltage Vi2 (namely, the other terminal voltage of the sense resistor Rs). Hence, the voltage difference across the sense resistor Rs is equal to Vi1−Vi2. In addition, the sense amplifier 102 amplifies the voltage difference (Vi1−Vi2) with a gain value Ga to output an amplified sense voltage Vo. Namely, the amplified sense voltage Vo is equal to (Vi1−Vi2)×Ga. The detailed description of different embodiments of the sense amplifier 102 will be made hereinafter with reference to FIG. 7 and FIG. 8.

Figure 4:
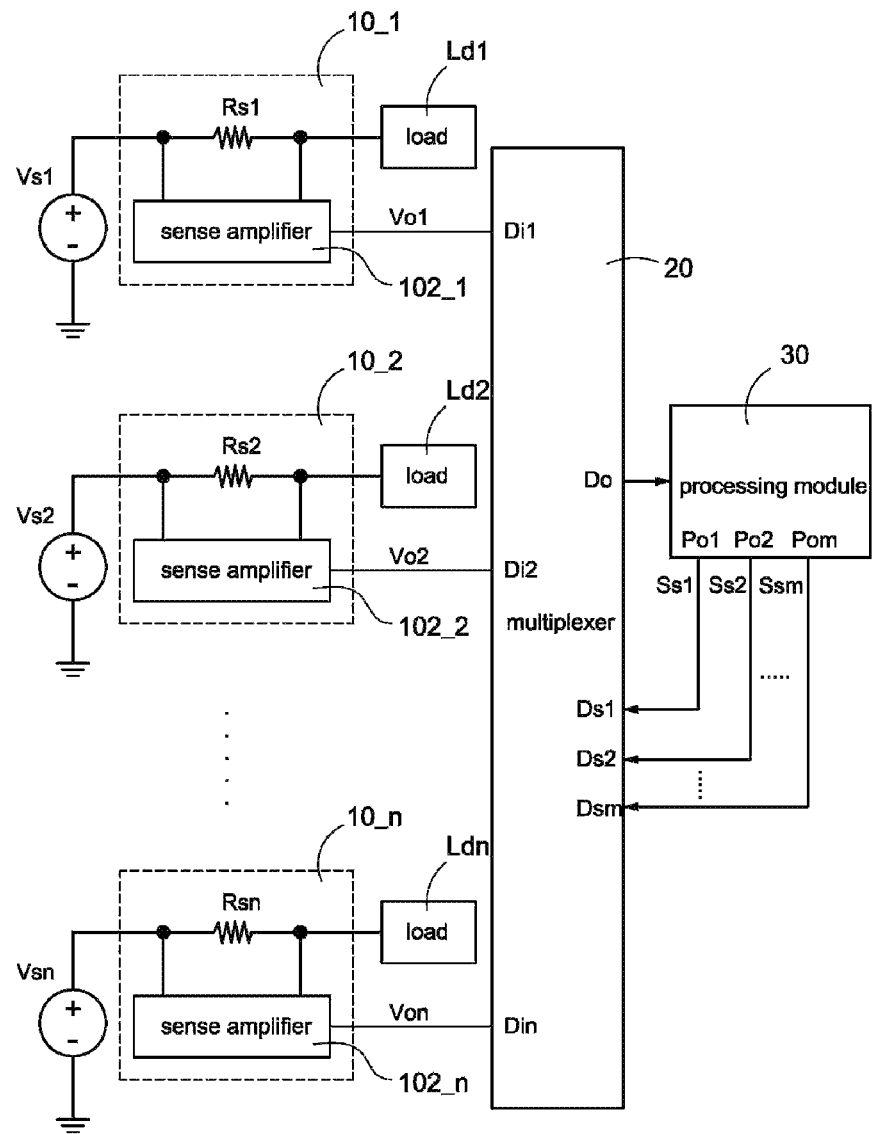
FIG. 4 is a schematic circuit block diagram of the power measurement system according to the present disclosure.

Reference is made to FIG. 4 which is a schematic circuit block diagram of the power measurement system according to the present disclosure. The power measurement system is provided to measure output powers of different power sources. The power measurement system includes a plurality of measurement apparatuses 10_1~10_n, a multiplexer 20, and a processing module 30. Each of the measurement apparatuses 10_1~10_n has a corresponding sense resistor Rs1~Rsn and a sense amplifier 102_1~102_n. Especially, each sense resistor Rs1~Rsn is a current resistor. One terminal of the sense resistor Rs1~Rsn is electrically connected to the power source Vs1~Vsn, respectively, and the other terminal of the sense resistor Rs1~Rsn is connected to the load Ld1~Ldn, respectively, so that the power measurement system is capable of measuring output powers of up to n different power sources. Accordingly, the measurement apparatuses 10_1~10_n respectively receive voltage differences across the sense resistors Rs1~Rsn and then respectively amplify the voltage differences with gain values Ga1~Gan to respectively output the amplified sense voltages Vo1~Von. Especially, the sense resistors Rs1~Rsn are current resistors and resistance value of the current resistor Rs1~Rsn is much less than that of the load Ld1~Ldn so that the current resistor Rs1~Rsn is preferably provided to detect current. The multiplexer 20 has a plurality of data input terminals Di1~Din, a data output terminal Do, and at least one data selection terminal Ds1~Dsm. The data input terminals Di1~Din receive the amplified sense voltages Vo1~Von outputted from the sense amplifiers 102_1~102_n, respectively.

Figure 5:
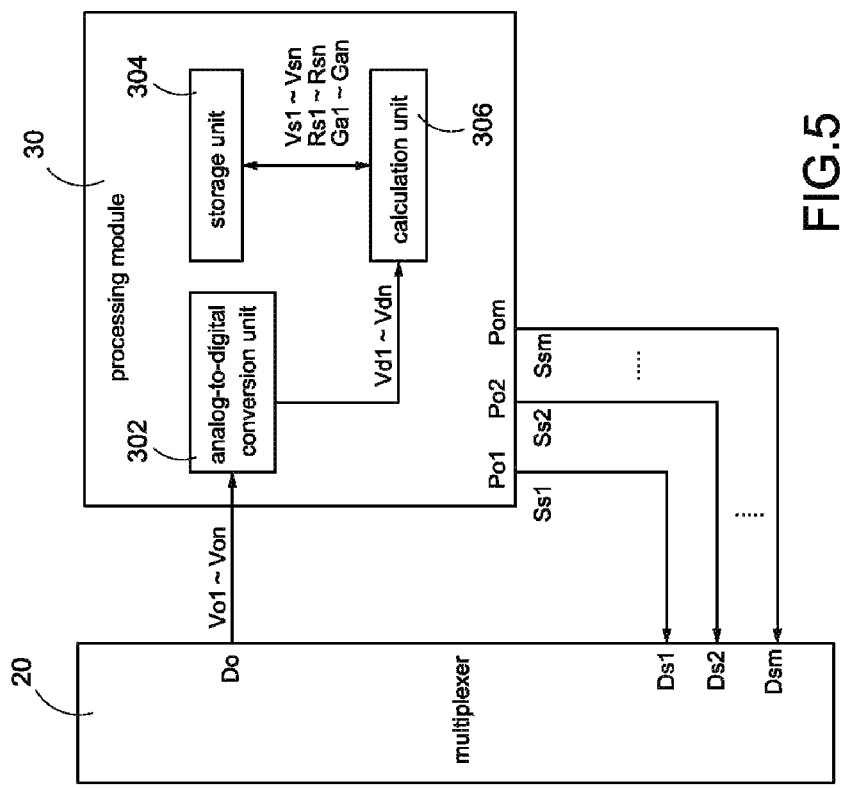
FIG. 5 is a schematic circuit block diagram of a processing module of the power measurement system according to a first embodiment of the present disclosure.
Figure 6:
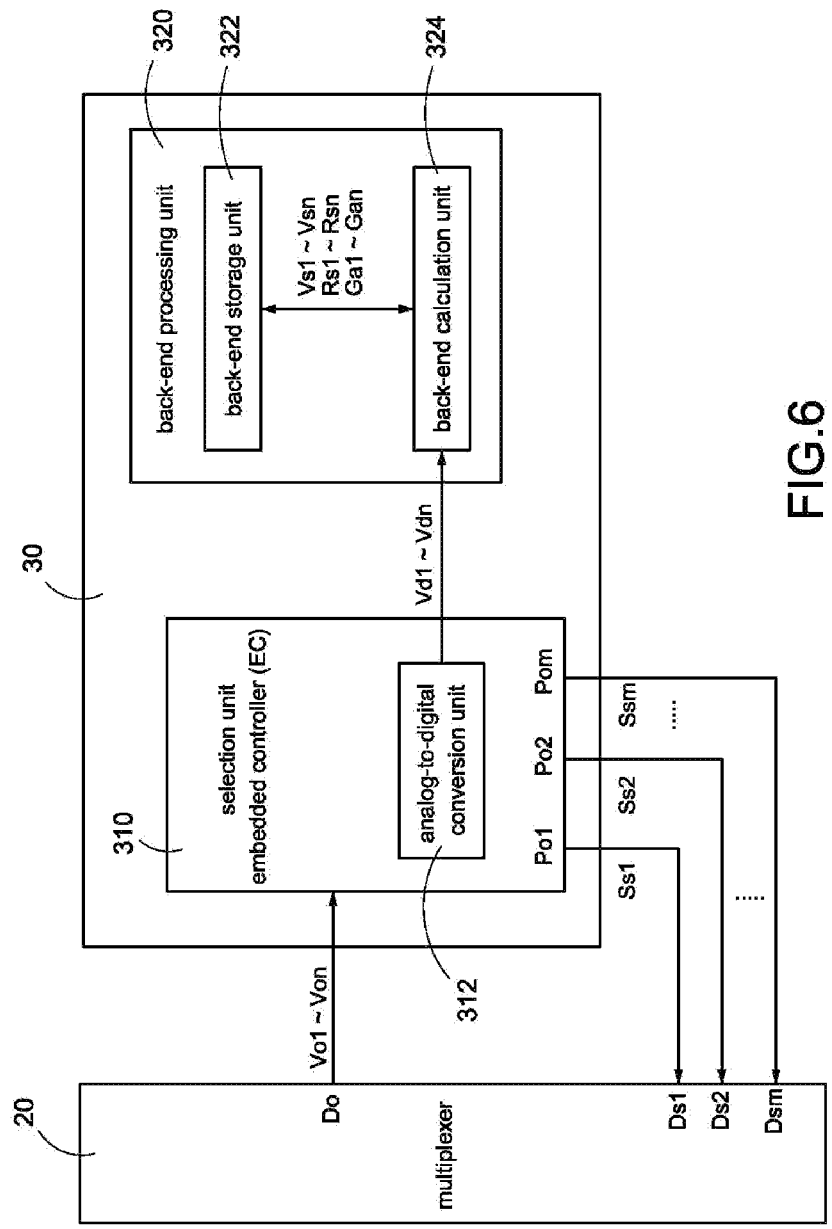
FIG. 6 is a schematic circuit block diagram of the processing module of the power measurement system according to a second embodiment of the present disclosure.

The processing module 30 outputs at least one selection signal Ss1~Ssm to the at least one data selection terminal Ds1~Dsm so as to control the multiplexer 20 outputting one of the amplified sense voltages Vo1~Von outputted from the data output terminal Do to be received by the processing module 30. In particular, the processing module 30 calculates output powers of the power sources Vs1~Vsn according to the amplified sense voltages Vo1~Von. Especially, the processing module 30 has an analog-to-digital conversion unit (as shown in FIG. 5 and FIG. 6) to digitalize the received amplified sense voltages Vo1~Von. In addition, the processing module 30 has at least one general purpose input/output pin Po1~Pom to output the at least one selection signal Ss1~Ssm to the at least one data selection terminal Ds1~Dsm so as to control the multiplexer 20 outputting the amplified sense voltages Vo1~Von outputted from the data output terminal Do. Especially, the amount of the selection signal Ss1~Ssm outputted from the general purpose input/output pin Po1~Pom matches the amount of the power source Vs1~Vsn. Also, the selection signals Ss1~Ssm are binary digital signals which are provided to control the multiplexer 20 outputting the amplified sense voltages Vo1~Von from the data output terminal Do. Note that, the quantity match between the selection signal Ss1~Ssm and the power source Vs1~Vsn means that if the power measurement system is capable of measuring output powers of up to eight (n=8) different power sources, the multiplexer 20 has eight data input terminals Di1~Di8, one data output terminal Do, and three data selection terminals Ds1~Ds3. That is, the multiplexer 20 is an 8-to-1 multiplexer. Accordingly, the processing module 30 has three general purpose input/output pins Po1~Po3 to output three selection signals Ss1~Ss3 to three data selection terminals Ds1~Ds3 so as to control the multiplexer 20 outputting one of eight amplified sense voltages Vo1~Vo8 from the data output terminal Do. In short, the relation between the parameters m and n is $n=2^m$. Similarly, if the power measurement system is capable of measuring output powers of up to sixteen (n=16) different power sources, the multiplexer 20 has sixteen data input terminals Di1~Di16, one data output terminal Do, and four data selection terminals Ds1~Ds4. That is, the multiplexer 20 is a 16-to-1 multiplexer. Accordingly, the processing module 30 has four general purpose input/output pins Po1~Po4 to output four selection signals Ss1~Ss4 to four data selection terminals Ds1~Ds4 so as to control the multiplexer 20 outputting one of sixteen amplified sense voltages Vo1~Vo16 from the data output terminal Do. In other words, if the amount of the power sources Vs1~Vsn is between five to eight, the amount of the selection signals Ss1~Ssm is three; if the amount of the power sources Vs1~Vsn is between nine to sixteen, the amount of the selection signals Ss1~Ssm is four, and so on. Accordingly, the amount of the selection signal Ss1~Ssm matches the amount of the power source Vs1~Vsn.

The detailed description of the processing module 30 in different embodiments and output power calculation of the power sources Vs1~Vsn will be made hereinafter with reference to FIG. 5 and FIG. 6. Reference is made to FIG. 5 which is a schematic circuit block diagram of a processing module of the power measurement system according to a first embodiment of the present disclosure. In this embodiment, the processing module 30 is an embedded controller (EC). The processing module 30 has an analog-to-digital conversion unit (ADC) 302, a storage unit 304, and a calculation unit 306. Especially, the processing module 30 stores the voltage values Vs1~Vsn of the power sources Vs1~Vsn, the resistance values of the sense resistors Rs1~Rsn, and the gain values Ga1~Gan of the sense amplifiers 102_1~102_n in the storage unit 304. The resistance values of the sense resistors Rs1~Rsn, and the gain values Ga1~Gan of the sense amplifiers 102_1~102_n may be recorded in a lookup table (LUT) stored in the storage unit 304. The analog-to-digital conversion unit 302 receives one of the amplified sense voltages Vo1~Von outputted from the data output terminal Do of the multiplexer 20. The analog amplified sense voltages Vo1~Von are converted into corresponding digital amplified sense voltages Vd1~Vdn and then the digital amplified sense voltages Vd1~Vdn are sent to the calculation unit 306. The calculation unit 306 correspondingly reads the voltage values of the power sources Vs1~Vsn, the resistance values of the sense resistors Rs1~Rsn, and the gain values Ga1~Gan of the sense amplifiers 102_1~102_n stored in the storage unit 304 according to one of the digital amplified sense voltages Vd1~Vdn sent from the analog-to-digital conversion unit 302. As a result, the output powers W1~Wn of the power sources Vs1~Vsn are calculated. In particular, a relational expression between the output powers W1~Wn and the digital amplified sense voltages Vd1~Vdn, the gain values Ga1~Gan, the resistance values Rs1~Rsn, and the voltage values Vs1~Vsn is shown as follows:

$$Wn=[(Vdn/Gan)/Rsn] \times Vsn,$$

In which, the output power Wn, the digital amplified sense voltage Vdn, the gain value Gan, and the resistance value Rsn are corresponding to the n-th power source Vsn, and the value of the parameter n is an integer number. Especially, (Vdn/Gan)/Rsn expresses the current value flowing through the sense resistor Rsn.

For convenient explanation, reasonable assumption data are exemplified for further demonstration of calculating output powers of different power sources in the power measurement system. It is assumed that there are eight power sources Vs1~Vs8 so that the power measurement system provides eight measurement apparatuses 10_1~10_8. The measurement apparatuses 10_1~10_8 respectively receive voltage differences across the sense resistors Rs1~Rs8 and then respectively amplify the voltage differences with gain values Ga1~Ga8 to respectively output the amplified sense voltages Vo1~Vo8. In addition, the multiplexer 20 has eight data input terminals Di1~Di8, a data output terminal Do, and three data selection terminals Ds1~Ds3. The data input terminals Di1~Di8 receive the amplified sense voltages Vo1~Vo8 outputted from the sense amplifiers 102_1~102_8, respectively. The processing module 30 outputs three selection signals Ss1~Ss3 to three data selection terminals Ds1~Ds3 so as to control the multiplexer 20 outputting one of the amplified sense voltages Vo1~Vo8 outputted from the data output terminal Do to be received by the processing module 30. The processing module 30 stores eight voltage values Vs1~Vs8, eight resistance values Rs1~Rs8, and eight gain values Ga1~Ga8. The analog-to-digital conversion unit 302 receives one of the amplified sense voltages Vo1~Vo8 outputted from the data output terminal Do of the multiplexer 20. The analog amplified sense voltages Vo1~Vo8 are converted into corresponding digital amplified sense voltages Vd1~Vd8 and then the digital amplified sense voltages Vd1~Vd8 are sent to the calculation unit 306. The calculation unit 306 correspondingly reads the voltage values of the power sources Vs1~Vs8, the resistance values of the sense resistors Rs1~Rs8, and the gain values Ga1~Ga8 of the sense amplifiers 102_1~102_8 stored in the storage unit 304 according to one of the digital amplified sense voltages Vd1~Vd8 sent from the analog-to-digital conversion unit 302. As a result, the output powers W1~W8 of the power sources Vs1~Vs8 are calculated.

It is assumed the above-mentioned parameter values recorded in the lookup table stored in the storage unit 304 are shown as follows:

| n | Vsn (V) | Rsn (Ω) | Gan |
|---|---------|---------|-----|
| 1 | 3.3 | 0.05 | 50 |
| 2 | 3.3 | 0.05 | 50 |
| 3 | 5.0 | 0.05 | 50 |

| n | Vsn (V) | Rsn (Ω) | Gan |
|---|---|---|---|
| 4 | 5.0 | 0.05 | 50 |
| 5 | 5.0 | 0.05 | 50 |
| 6 | 5.0 | 0.05 | 50 |
| 7 | 12.0 | 0.05 | 50 |
| 8 | 12.0 | 0.05 | 50 |

As describe above, the processing module 30 outputs the three selection signals Ss1~Ss3 to the three data selection terminals Ds1~Ds3 so as to control the multiplexer 20 outputting one of the eight amplified sense voltages Vo1~Vo8. Hence, the three selection signals Ss1~Ss3 and the eight digital amplified sense voltages Vd1~Vd8 received by the calculation unit 306 are expressed as follows:

| n | Ss1 | Ss2 | Ss3 | Vdn (V) |
|---|---|---|---|---|
| 1 | 0 | 0 | 0 | 2.4 |
| 2 | 0 | 0 | 1 | 1.8 |
| 3 | 0 | 1 | 0 | 3.2 |
| 4 | 0 | 1 | 1 | 2.1 |
| 5 | 1 | 0 | 0 | 3.3 |
| 6 | 1 | 0 | 1 | 2.9 |
| 7 | 1 | 1 | 0 | 1.2 |
| 8 | 1 | 1 | 1 | 2.3 |

As a result, the eight output powers W1~W8 of the power sources Vs1~Vs8 are calculated by the calculation unit 306 according to the relational expression $(W_n=[(V_{dn}/G_{an})/R_{sn}]\times V_{sn})$:

| n | Ss1 | Ss2 | Ss3 | Wn (W) |
|---|---|---|---|---|
| 1 | 0 | 0 | 0 | 3.168 |
| 2 | 0 | 0 | 1 | 2.376 |
| 3 | 0 | 1 | 0 | 6.400 |
| 4 | 0 | 1 | 1 | 4.200 |
| 5 | 1 | 0 | 0 | 6.600 |
| 6 | 1 | 0 | 1 | 5.800 |
| 7 | 1 | 1 | 0 | 5.760 |
| 8 | 1 | 1 | 1 | 11.040 |

Especially, the processing module 30 controls the multiplexer 20 receiving the amplified sense voltages Vo1~Von by using a sequential way or a random way according to a system clock. That is, the processing module 30 can sequentially receive the eight amplified sense voltages Vo1~Vo8 according to the system clock in milliseconds when the three selection signals Ss1~Ss3 change from "000" to "111". Also, the processing module 30 can randomly receive the eight amplified sense voltages Vo1~Vo8 corresponding to the 3-bit binary value of the three selection signals Ss1~Ss3. For example, when the 3-bit binary value of the selection signals Ss1~Ss3 is "010", the analog amplified sense voltage Vo3 outputted from the multiplexer 20 is 3.2 volts. Afterward, the analog amplified sense voltage Vo3 is converted into the digital amplified sense voltage Vd3 and then the output power W3 of the power source Vs3 is calculated as 6.4 watts by the calculation unit 306. Similarly, when the 3-bit binary value of the selection signals Ss1~Ss3 is "110", the analog amplified sense voltage Vo7 outputted from the multiplexer 20 is 1.2 volts. Afterward, the analog amplified sense voltage Vo7 is converted into the digital amplified sense voltage Vd7 and then the output power W7 of the power source Vs7 is calculated as 5.76 watts by the calculation unit 306. Also, the rest may be deduced by analogy. Hence, the detail description is omitted here for conciseness. Especially, the individual calculated output power W1~Wn can be summed up to obtain the total output power of the power measurement system for supplying power the loads Ld1~Ldn from the power sources Vs1~Vsn.

Reference is made to FIG. 6 which is a schematic circuit block diagram of the processing module of the power measurement system according to a second embodiment of the present disclosure. In this embodiment, the processing module 30 has a selection unit 310 and a back-end processing unit 320. In particular, the selection unit 310 is an embedded controller (EC). The selection unit 310 has an analog-to-digital conversion unit (ADC) 312. The back-end processing unit 320 has a back-end storage unit 322 and a back-end calculation unit 324. The selection unit 310 outputs the at least one selection signal Ss1~Ssm to control the multiplexer 20 outputting one of the amplified sense voltages Vo1~Von to be received by the selection unit 310. The analog-to-digital conversion unit 312 receives one of the amplified sense voltages Vo1~Von outputted from the data output terminal Do of the multiplexer 20. The analog amplified sense voltages Vo1~Von are converted into corresponding digital amplified sense voltages Vd1~Vdn and then the digital amplified sense voltages Vd1~Vdn are sent to the back-end calculation unit 324 of the back-end processing unit 320. Especially, the processing module 30 accesses the voltage values of the power sources Vs1~Vsn, the resistance values of the sense resistors Rs1~Rsn, and the gain values Ga1~Gan of the sense amplifiers 102_1~102_n in the back-end storage unit 322 of the back-end processing unit 320. The resistance values of the sense resistors Rs1~Rsn, and the gain values Ga1~Gan of the sense amplifiers 102_1~102_n may be recorded in the lookup table (LUT) stored in the back-end storage unit 322. The back-end calculation unit 324 correspondingly reads the voltage values of the power sources Vs1~Vsn, the resistance values of the sense resistors Rs1~Rsn, and the gain values Ga1~Gan of the sense amplifiers 102_1~102_n stored in the back-end storage unit 322 according to one of the digital amplified sense voltages Vd1~Vdn sent from the analog-to-digital conversion unit 312. As a result, the output powers W1~Wn of the power sources Vs1~Vsn are calculated. In particular, a relational expression between the output powers W1~Wn and the digital amplified sense voltages Vd1~Vdn, the gain values Ga1~Gan, the resistance values Rs1~Rsn, and the voltage values Vs1~Vsn is shown as follows:

$$Wn=[(Vdn/Gan)/Rsn]\times Vsn,$$

In which, the output power Wn, the digital amplified sense voltage Vdn, the gain value Gan, and the resistance value Rsn are corresponding to the n-th power source Vsn, and the value of the parameter n is an integer number. Especially, (Vdn/Gan)/Rsn expresses the current value flowing through the sense resistor Rsn.

For convenient explanation, reasonable assumption data are exemplified for further demonstration of calculating output powers of different power sources in the power measurement system. It is assumed that there are four power sources Vs1~Vs4 so that the power measurement system provides four measurement apparatuses 10_1~10_4. The measurement apparatuses 10_1~10_4 respectively receive voltage differences across the sense resistors Rs1~Rs4 and then respectively amplify the voltage differences with gain values Ga1~Ga4 to respectively output the amplified sense voltages Vo1~Vo4. In addition, the multiplexer 20 has four data input terminals Di1~Di4, a data output terminal Do, and two data selection terminals Ds1~Ds2. The data input terminals Di1~Di4 receive the amplified sense voltages Vo1~Vo4 outputted from the sense amplifiers 102_1~102_4, respectively. The processing module 30 outputs two selection signals Ss1~Ss2 to two data selection terminals Ds1~Ds2 so as to control the multiplexer 20 outputting one of the amplified sense voltages Vo1~Vo4 from the data output terminal Do to be received by the processing module 30. The processing module 30 stores four voltage values Vs1~Vs4, four resistance values Rs1~Rs4, and four gain values Ga1~Ga4. The analog-to-digital conversion unit 312 receives one of the amplified sense voltages Vo1~Vo4 outputted from the data output terminal Do of the multiplexer 20. The analog amplified sense voltages Vo1~Vo4 are converted into corresponding digital amplified sense voltages Vd1~Vd4 and then the digital amplified sense voltages Vd1~Vd4 are sent to the back-end calculation unit 324. The back-end calculation unit 324 correspondingly reads the voltage values of the power sources Vs1~Vs4, the resistance values of the sense resistors Rs1~Rs4, and the gain values Ga1~Ga4 of the sense amplifiers 102_1~102_4 stored in the back-end storage unit 322 according to one of the digital amplified sense voltages Vd1~Vd4 sent from the analog-to-digital conversion unit 312. As a result, the output powers W1~W4 of the power sources Vs1~Vs4 are calculated.

It is assumed the above-mentioned parameter values recorded in the lookup table stored in the back-end storage unit 322 are shown as follows:

| n | Vsn (V) | Rsn (Ω) | Gan |
|---|---------|---------|-----|
| 1 | 3.3     | 0.01    | 100 |
| 2 | 5.0     | 0.01    | 100 |
| 3 | 5.0     | 0.01    | 100 |
| 4 | 12.0    | 0.01    | 100 |

As describe above, the processing module 30 outputs the two selection signals Ss1~Ss2 to the two data selection terminals Ds1~Ds2 so as to control the multiplexer 20 outputting one of the four amplified sense voltages Vo1~Vo4. Hence, the two selection signals Ss1~Ss2 and the four digital amplified sense voltages Vd1~Vd4 received by the back-end calculation unit 324 are expressed as follows:

| n | Ss1 | Ss2 | Vdn (V) |
|---|-----|-----|---------|
| 1 | 0   | 0   | 3.0     |
| 2 | 0   | 1   | 2.7     |
| 3 | 1   | 0   | 2.9     |
| 4 | 1   | 1   | 2.1     |

As a result, the four output powers W1~W4 of the power sources Vs1~Vs4 are calculated by the back-end calculation unit 324 according to the relational expression (Wn=[(Vdn/Gan)/Rsn]×Vsn):

| n | Ss1 | Ss2 | Wn (W) |
|---|-----|-----|--------|
| 1 | 0   | 0   | 9.900  |
| 2 | 0   | 1   | 8.910  |
| 3 | 1   | 0   | 9.570  |
| 4 | 1   | 1   | 6.930  |

Especially, the processing module 30 controls the multiplexer 20 receiving the amplified sense voltages Vo1~Von by using a sequential way or a random way according to a system clock. That is, the processing module 30 can sequentially receive the four amplified sense voltages Vo1~Vo4 according to the system clock in milliseconds when the two selection signals Ss1~Ss2 change from "00" to "11". Also, the processing module 30 can randomly receive the four amplified sense voltages Vo1~Vo4 corresponding to the 2-bit binary value of the two selection signals Ss1~Ss2. For example, when the 2-bit binary value of the selection signals Ss1~Ss2 is "01", the analog amplified sense voltage Vo2 outputted from the multiplexer 20 is 2.7 volts. Afterward, the analog amplified sense voltage Vo2 is converted into the digital amplified sense voltage Vd2 and then the output power W2 of the power source Vs2 is calculated as 8.91 watts by the back-end calculation unit 324. Similarly, when the 2-bit binary value of the selection signals Ss1~Ss2 is "11", the analog amplified sense voltage Vo4 outputted from the multiplexer 20 is 2.1 volts. Afterward, the analog amplified sense voltage Vo4 is converted into the digital amplified sense voltage Vd4 and then the output power W4 of the power source Vs4 is calculated as 6.93 watts by the back-end calculation unit 324. Also, the rest may be deduced by analogy. Hence, the detail description is omitted here for conciseness. Especially, the individual calculated output power W1~Wn can be summed up to obtain the total output power of the power measurement system for supplying power the loads Ld1~Ldn from the power sources Vs1~Vsn.

Figure 7:
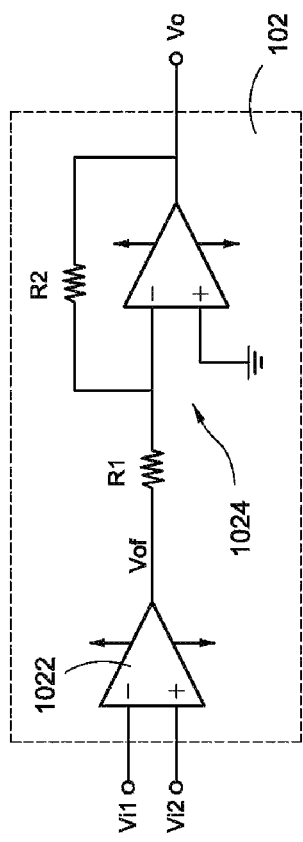
FIG. 7 is a circuit diagram of a sense amplifier of the power measurement system according to a first embodiment of the present disclosure.

In addition, the sense amplifier 102 is a differential amplifier. Reference is made to FIG. 7 which is a circuit diagram of a sense amplifier of the power measurement system according to a first embodiment of the present disclosure. The sense amplifier 102 has a voltage follower 1022 (also referred to as a unity-gain buffer) and an inverting amplifier 1024. The sense amplifier 102 receives the first input voltage Vi1 and the second input voltage Vi2 and produces an output voltage Vof. In particular, the output voltage Vof is equal to (Vi2−Vi1). The inverting amplifier 1024 is composed of an operational amplifier (not labeled), a first resistor R1, and a second resistor R2. The first resistor R1 is connected between an output terminal of the voltage follower 1022 and an inverting input terminal of the operational amplifier. The second resistor R2 is connected between the inverting input terminal of the operational amplifier and an output terminal of the operational amplifier. Also, a non-inverting input terminal of the operational amplifier is connected to a ground. Accordingly, the circuit structure of the inverting amplifier 1024 is formed as mentioned above. The inverting input terminal of the operational amplifier receives the output voltage Vof and produces an output voltage Vo. In particular, the output voltage Vo is equal to (Vi1−Vi2)×(R2/R1). As mentioned above, the sense amplifier 102 receives the voltage difference across the sense resistor Rs, amplifies the voltage difference with the gain value Ga, and outputs the amplified sense voltage Vo. In which, the voltage difference is equal to (Vi1−Vi2), the gain value Ga is equal to R2/R1, and the amplified sense voltage Vo is equal to (Vi1−Vi2)×(R2/R1).

Figure 8:
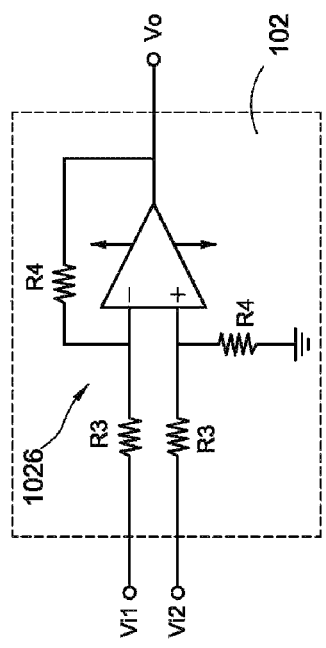
FIG. 8 is a circuit diagram of the sense amplifier of the power measurement system according to a second embodiment of the present disclosure.

Reference is made to FIG. 8 which is a circuit diagram of the sense amplifier of the power measurement system according to a second embodiment of the present disclosure. The sense amplifier 102 is a differential amplifier 1026. The differential amplifier 1026 is composed of an operational amplifier (not labeled), two third resistors R3, and two fourth resistors R4. The two third resistors R3 are respectively connected to an inverting input terminal and a non-inverting input terminal of the operational amplifier to receive the first input voltage Vi1 and the second input voltage Vi2. One of the fourth resistors R4 is connected between the inverting input terminal and an output terminal of the operational amplifier and the other of the fourth resistors R4 is connected between the non-inverting input terminal of the operational amplifier and a ground. Accordingly, the circuit structure of the differential amplifier 1026 is formed as mentioned above. The operational amplifier 1026 produces an output voltage Vo and the output voltage Vo is equal to (Vi1−Vi2)×(R4/R3). As mentioned above, the sense amplifier 102 receives the voltage difference across the sense resistor Rs, amplifies the voltage difference with the gain value Ga, and outputs the amplified sense voltage Vo. In which, the voltage difference is equal to (Vi1−Vi2), the gain value Ga is equal to R4/R3, and the amplified sense voltage Vo is equal to (Vi1−Vi2)×(R4/R3).

Figure 9:
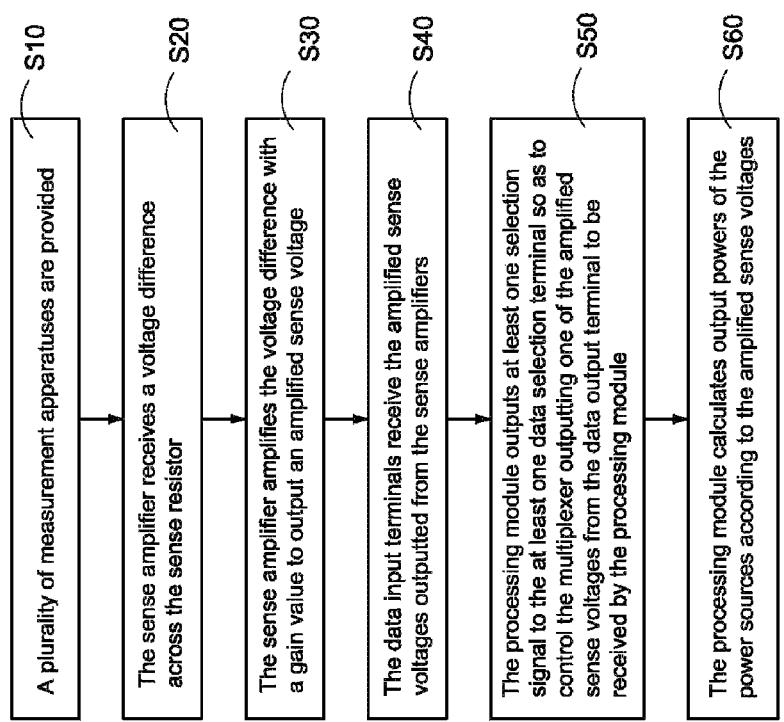
FIG. 9 is a flowchart of a method of operating the power measurement system according to the present disclosure.

Reference is made to FIG. 9 which is a flowchart of a method of operating the power measurement system according to the present disclosure. The method includes following steps: a plurality of measurement apparatuses are provided (S10). Each of the measurement apparatuses has a sense resistor and the sense resistor is a current resistor. One terminal of the sense resistor is electrically connected to a power source and the other terminal of the sense resistor is connected to a load. Each measurement apparatus further has a sense amplifier. The sense amplifier receives a voltage difference across the sense resistor (S20). The sense amplifier receives a first input voltage (namely, one terminal voltage of the sense resistor) and a second input voltage (namely, the other terminal voltage of the sense resistor). Hence, the voltage difference across the sense resistor is equal to (Vi1−Vi2). In addition, the sense amplifier amplifies the voltage difference (Vi1−Vi2) with a gain value (Ga) to output an amplified sense voltage (Vo) (S30). Namely, the amplified sense voltage (Vo) is equal to (Vi1−Vi2)×Ga. Afterward, a multiplexer is provided. The multiplexer has a plurality of data input terminals, a data output terminal, and at least one data selection terminal. The data input terminals receive the amplified sense voltages outputted from the sense amplifiers (S40). Especially, the processing module controls the multiplexer receiving the amplified sense voltages by using a sequential way or a random way according to a system clock. Afterward, a processing module outputs at least one selection signal to the at least one data selection terminal so as to control the multiplexer outputting one of the amplified sense voltages from the data output terminal to be received by the processing module (S50). In particular, the amplified sense voltages are digitalized by the processing module to produce corresponding digital amplified sense voltages. Especially, the processing module is an embedded controller (EC). The processing module calculates output powers of the power sources according to the amplified sense voltages (S60). Especially, the processing module accesses the voltage values (Vs) of the power sources, the resistance values (Rs) of the sense resistors, and the gain values (Ga) of the sense amplifiers in a storage unit. The resistance value (Rs) of the sense resistors, and the gain value (Ga) of the sense amplifiers may be recorded in a lookup table (LUT) stored in the storage unit. According to the digital amplified sense voltages, the output powers (Wn) of the power sources can be calculated. In particular, a relational expression between the output powers (Wn) and the digital amplified sense voltages (Vdn), the gain values (Ga), the resistance values (Rs), and the voltage values (Vs) is shown as follows:

$$Wn=[(Vdn/Gan)/Rsn]\times Vsn,$$

In which, the output power (Wn), the digital amplified sense voltage (Vdn), the gain value (Gan), and the resistance resistor (Rsn) are corresponding to the n-th power source (Vsn), and the value of the parameter n is an integer number. Especially, (Vdn/Gan)/Rsn expresses the current value flowing through the sense resistor (Rsn).

Note that, the above-mentioned amplified sense voltages can also be fully processed by using the analogy way, namely, without digitalizing the amplified sense voltages to produce corresponding digital amplified sense voltages. In addition, the individual calculated output power can be summed up to obtain the total output power of the power measurement system for supplying power the loads from the power sources. Accordingly, the above-mentioned steps can be executed to measure output powers of the different power sources.

In conclusion, the present disclosure has following advantages:

1. The multiplexer 20 with a characteristic of "multiple input and single output (n-to-1)" is provided to simultaneously connect to a plurality of power sources Vs1~Vsn to calculate output powers of the power sources Vs1~Vsn by controlling external selection signals;

2. The amount of calculating output powers of the power sources Vs1~Vsn can be increased by correspondingly expanding the amount of the data input terminals Di1~Din, the data selection terminals Ds1~Dsn, and the general purpose input/output pins Po1~Pom;

3. The sense amplifier 102 is provided to amplify the voltage difference across the sense resistor (current resistor) Rn about number of times and output the amplified sense voltage because the unamplified voltage may be easily interfered during the transmission process;

4. The embedded controller (EC) is provided as the processing module 30 and the multiplexer 20 is also provided to select one of the amplified sense voltages so that only one analog-to-digital conversion signal is used to measure output powers of multiple power sources;

5. The bit number of the analog-to-digital conversion unit 302 can be increased to raise the resolution of signal processing;

6. The processing module 30 controls the multiplexer 20 receiving the amplified sense voltages Vo1~Von by using a sequential way or a random way; and 7. The individual calculated output power W1~Wn can be summed up to obtain the total output power of the power measurement system for supplying power the loads Ld1~Ldn from the power sources Vs1~Vsn.

Although the present invention has been described with reference to the preferred embodiment thereof, it will be understood that the invention is not limited to the details thereof. Various substitutions and modifications have been suggested in the foregoing description, and others will occur to those of ordinary skill in the art. Therefore, all such substitutions and modifications are intended to be embraced within the scope of the invention as defined in the appended claims.

What is claimed is:

1. A power measurement system for multiple power sources calculating output powers of different power sources, comprising:
    a plurality of measurement apparatuses, each of the measurement apparatuses having:
        a sense resistor, one terminal of the sensor resistor electrically connected to a power source and another terminal of the sensor resistor connected to a load; and
        a sense amplifier configured to receive a voltage difference across the sense resistor, amplify the voltage difference with a gain value, and output an amplified sense voltage;
    a multiplexer having a plurality of data input terminals, a data output terminal, and at least one data selection terminal, the data input terminals receiving the amplified sense voltages outputted from the measurement apparatuses, respectively; and a processing module configured to output at least one selection signal to the at least one data selection terminal to control the multiplexer selecting one of the amplified sense voltages outputted from the data output terminal of the multiplexer, and receive the selected amplified sense voltage;

wherein the processing module is configured to calculate an output power of the power source according to the received amplified sense voltage.

2. The power measurement system in claim 1, wherein the processing module is an embedded controller (EC).

3. The power measurement system in claim 2, wherein the processing module is configure to store voltage values (Vs) of the power sources, resistance values (Rs) of the sense resistors, and gain values (Ga) in a lookup table.

4. The power measurement system in claim 3, wherein the processing module is configured to read the stored voltage values (Vs), resistance values (Rs), gain values (Ga) in the lookup table to calculate the output powers (Wn) of the power sources; and a relational expression between the output powers (Wn), the amplified sense voltages (Vm), the gain values (Ga), the resistance values (Rs), and the voltage values (Vs) is:

$$Wn=[(Vm/Ga)/Rs]\times Vs.$$

5. The power measurement system in claim 1, wherein the processing module comprises:

a selection unit is configured to output the selection signal and control the multiplexer outputting one of the amplified sense voltages, and the one of the amplified sense voltages is received by the selection unit; and a back-end processing unit is configured to receive the amplified sense voltage outputted from the selection unit and calculate the output power of the power source according to the received amplified sense voltage.

6. The power measurement system in claim 5, wherein the selection unit is an embedded control (EC).

7. The power measurement system in claim 5, wherein the back-end processing unit is configure to store voltage values (Vs) of the power sources, resistance values (Rs) of the sense resistors, and gain values (Ga) in a lookup table.

8. The power measurement system in claim 7, wherein the back-end processing unit is configured to read the stored voltage values (Vs), resistance values (Rs), gain values (Ga) in the lookup table to calculate the output powers (Wn) of the power sources; and a relational expression between the output powers (Wn), the amplified sense voltages (Vm), the gain values (Ga), the resistance values (Rs), and the voltage values (Vs) is:

$$Wn=[(Vm/Ga)/Rs]\times Vs.$$

9. The power measurement system in claim 1, wherein the processing module is configured to control the multiplexer receiving the amplified sense voltages by using a sequential way or a random way.

10. The power measurement system in claim 1, wherein the sense amplifier is a differential amplifier and the sense resistor is a current resistor; the sense amplifier is configured to receive the voltage difference across the current resistor and amplify the voltage difference to the amplified sense voltage.

11. The power measurement system in claim 1, wherein the processing module has an analog-to-digital conversion unit, the analog-to-digital conversion unit is configured to digitalize the received amplified sense voltage.

12. The power measurement system in claim 1, wherein the processing module has at least one general purpose input/output pin to output the least one selection signal to the data selection terminal so that the processing module is configured to control the multiplexer outputting the amplified sense voltage from the data output terminal.

13. The power measurement system in claim 12, wherein the amount of the least one selection signal produced from the at least one general purpose input/output pin matches the amount of the power source, and the at least one selection signal is a binary digital signal provided to control the multiplexer outputting the amplified sense voltage from the data output terminal.

14. A method of operating a power measurement system for measuring output powers of multiple power sources, steps of the method comprising:

providing a plurality of measurement apparatuses, each of the measurement apparatuses has a sense resistor, one terminal of the sensor resistor electrically connected to a power source and another terminal of the sensor resistor connected to a load;

receiving a voltage difference across the sense resistor;

amplify the voltage difference with a gain value to produce an amplified sense voltage;

receiving the amplified sense voltages;

selecting one of the amplified sense voltages; and calculating an output power of the power source according to the selected amplified sense voltage.

15. The method of operating the power measurement system for multiple power sources in claim 14, wherein the step of selecting one of the amplified sense voltages is executed by an embedded control (EC).

16. The method of operating the power measurement system for multiple power sources in claim 14, wherein the step of calculating the output power of the power source further comprises:

reading a lookup table to obtain the amplified sense voltages (Vm), the gain values (Ga), resistance values (Rs) of the sense resistors, and voltage values (Vs) of the power sources;

calculating output powers (Wn) of the power sources;

wherein a relational expression between the output powers (Wn), the amplified sense voltages (Vm), the gain values (Ga), the resistance values, and the voltage values (Vs) is:

$$Wn=[(Vm/Ga)/Rs]\times Vs.$$

17. The method of operating the power measurement system for multiple power sources in claim 14, wherein the step of receiving the amplified sense voltages is executed by using a sequential way or a random way according to a system clock.

18. The method of operating the power measurement system for multiple power sources in claim 14, wherein the sense resistor is a current resistor.

19. The method of operating the power measurement system for multiple power sources in claim 14, wherein the step of calculating the output power of the power source according to the selected amplified sense voltage further comprising: digitalizing the selected amplified sense voltage.

* * * * *